(12) United States Patent
Jang

(10) Patent No.: US 11,011,561 B2
(45) Date of Patent: May 18, 2021

(54) PIXEL AND IMAGE SENSOR INCLUDING THE SAME

(71) Applicant: SK hynix Inc., Icheon-si (KR)

(72) Inventor: Jae Hyung Jang, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/598,917

(22) Filed: Oct. 10, 2019

(65) Prior Publication Data

US 2021/0005653 A1 Jan. 7, 2021

(30) Foreign Application Priority Data

Jul. 1, 2019 (KR) .................. 10-2019-0078699

(51) Int. Cl.
*H01L 27/146* (2006.01)
*H01L 31/0352* (2006.01)

(52) U.S. Cl.
CPC .... *H01L 27/14616* (2013.01); *H01L 27/1461* (2013.01); *H01L 27/14605* (2013.01); *H01L 27/14607* (2013.01); *H01L 27/14609* (2013.01); *H01L 31/0352* (2013.01)

(58) Field of Classification Search
CPC ......... H01L 27/14605; H01L 27/14607; H01L 27/14609; H01L 27/1461; H01L 27/14616; H01L 31/02027; H01L 31/0352; H01L 31/035281
USPC .................. 257/225, 228, 233, 290–292
See application file for complete search history.

(56) References Cited

U.S. PATENT DOCUMENTS

| | | | |
|---|---|---|---|
| 2011/0255071 A1* | 10/2011 | Van Der Tempel | G01S 7/4913 356/5.01 |
| 2016/0209480 A1* | 7/2016 | Hioka | G01R 33/077 |
| 2018/0372846 A1* | 12/2018 | Izuhara | G01S 17/894 |
| 2019/0006399 A1* | 1/2019 | Otake | H01L 31/107 |
| 2020/0028017 A1* | 1/2020 | Imoto | H01L 31/022408 |
| 2020/0382737 A1* | 12/2020 | Kajiwara | G01S 17/89 |

FOREIGN PATENT DOCUMENTS

| | | |
|---|---|---|
| KR | 10-1105635 | 1/2012 |
| KR | 10-2014-0015292 | 2/2014 |

\* cited by examiner

*Primary Examiner* — Matthew E Warren
(74) *Attorney, Agent, or Firm* — Perkins Coie LLP

(57) ABSTRACT

A pixel of an image sensor is provided to include a control region and a detection region. The control region is configured to generate hole current in a substrate, and a detection region is configured to capture electrons generated by incident light and moved by the hole current. A depth of an outer detection region of the detection region is deeper than a depth of an inner detection region of the detection region.

20 Claims, 11 Drawing Sheets

PIXEL AND IMAGE SENSOR INCLUDING THE SAME

CROSS-REFERENCE TO RELATED APPLICATIONS

This patent document claims priority and benefits of Korean Patent Application No. 10-2019-0078699 filed on Jul. 1, 2019 in the Korean Intellectual Property Office, which is incorporated herein by reference in its entirety.

TECHNICAL FIELD

The technology and implementations disclosed in this patent document relate to an image sensor including a pixel circuit.

BACKGROUND

An image sensor is a semiconductor device which captures light that is incident thereon to produce an image. Recently, with the development of the computer industry and communication industry, the demand for an image sensor having improved performance has been increasing in concert with improvements in various electronic devices such as smartphones, digital cameras, video game equipment, devices for use with the Internet of Things, robots, security cameras and medical micro cameras.

Image sensors may be generally divided into CCD (charge coupled device) image sensors and CMOS (complementary metal oxide semiconductor) image sensors. CCD image sensors have less noise and better image quality than CMOS image sensors. However, CMOS image sensors have a simpler and more convenient driving scheme, and thus may be preferred in some applications. Also, CMOS image sensors may integrate a signal processing circuit in a single chip, making it easy to miniaturize the sensors for implementation in a product, with the added benefit of consuming very low power. CMOS image sensors can be fabricated using a CMOS process technology, which results in low manufacturing costs. CMOS image sensing devices have been widely used due to their suitability for implementation in a mobile device.

SUMMARY

The disclosed technology relates to an image sensor pixel and an image sensor including an image sensor pixel. Some implementations of the disclosed technology allow to reduce or avoid the occurrence of undesired effects, e.g., noise and crosstalk.

In an embodiment, a pixel of an image sensor may include: a control region configured to generate hole current in a substrate; and a detection region configured to capture electrons generated by incident light and moved by the hole current, wherein a depth of an outer detection region of the detection region is deeper than a depth of an inner detection region of the detection region.

In an embodiment, an image sensor may include: a first pixel and a second pixel disposed adjacent to each other, wherein each of the first pixel and the second pixel comprises a control region which generates hole current in a substrate and a detection region which captures electrons generated by incident light and moved by the hole current, and wherein a depth of an outer detection region of the detection region is deeper than a depth of an inner detection region of the detection region.

In an embodiment, an image sensor may include: a plurality of pixels each including first and second control regions which generate hole current in a substrate and first and second detection regions which capture electrons generated by incident light and moved by the hole current; a row decoder configured to drive the plurality of pixels; and a pixel signal processing circuit configured to perform noise removal and analog-digital conversion for pixel signals outputted from the plurality of pixels, wherein a depth of an outer detection region of each detection region is deeper than a depth of an inner detection region of each detection region.

According to the embodiments disclosed in the present document, by preventing a phenomenon in which electrons generated in a substrate positioned between adjacent CAPD pixels move into the CAPD pixels, noise and crosstalk included in a pixel signal may be reduced, and the uniformity of demodulation contrast may be improved due to the reduction in crosstalk component.

As a method for improving crosstalk without a process such as backside deep trench isolation (BDTI) or frontside deep trench isolation (FDTI) for pixel isolation, a process may be simplified, and a side effect such as noise or dark current generated in the process may be prevented.

Besides, a variety of effects directly or indirectly understood through the present document may be provided.

DETAILED DESCRIPTION

This patent document provides implementations and examples of an image sensing device. Some implementations of the disclosed technology provide a design for an image sensing device which can reduce and prevent noise and crosstalk. In some implementations, the noise and cross talk may be caused during an operation of a CAPD pixel circuit, when the image sensing device is an in-direct type ToF sensing device.

There have been much development and studies for measuring range and depth by using an image sensor. The demands for the technologies of measuring range and depth are rapidly increasing in the various fields including security, medical devices, automobiles, game consoles, VR/AR, and/or mobile devices. The representative technologies include triangulation systems, time-of-flight systems, or interferometry systems. Among these systems, the time-of-flight systems get more attention because of their wide range of utilization, high processing speed, and cost advantages. The time-of-flight (ToF) systems measure a distance using emitted light and reflected light. The ToF systems can be classified into two different types, i.e., a direct type and an indirect type, depending on whether it is the roundtrip time or the phase difference that determines the distance. In the direct type ToF systems, a distance is measured by calculating a round trip time. In the indirect type ToF systems, a distance is measured by using a phase difference. The direct type ToF systems are generally used for automobiles because they are suitable for measuring long distances. The indirect type ToF systems are generally used for game devices or mobile cameras that are associated with shorter distances and require faster processing speed. As compared to the direct type ToF systems, the indirect type ToF systems have several advantages, including having simpler circuitry, low memory requirement, and a relatively low cost.

A current-assisted photonic demodulator (CAPD) is one type of pixel circuitry used in an indirect ToF sensor. In CAPD, electrons are generated in a pixel circuit by using majority current that is created through an application of a substrate voltage, and the generated electrons are detected by using the potential difference of an electric field; the electrons can be quickly detected because the majority current is used. In addition, the CAPD has an excellent efficiency by detecting the electrons which are disposed in deep locations.

Hereinafter, various embodiments of the disclosed technology will be described with reference to the accompanying drawings. However, the description is not intended to limit the present disclosure to particular embodiments, and it should be construed as including various modifications, equivalents, and/or alternatives according to the embodiments of the disclosed technology.

Figure 1:
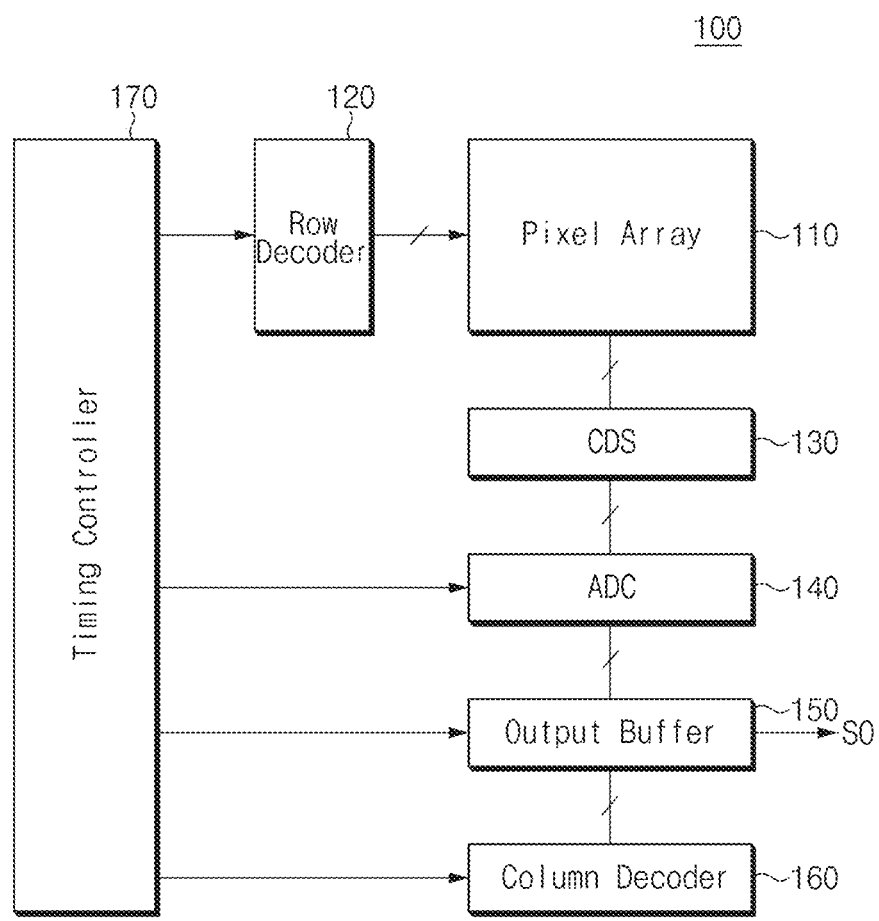
FIG. 1 is a block diagram illustrating an example image sensor based on some implementations of the disclosed technology.

FIG. 1 is a block diagram illustrating a representation of an example of an image sensor in accordance with an embodiment of the disclosed technology.

Referring to FIG. 1, an image sensor 100 may include a pixel array 110, a row decoder 120, a correlated double sampler (CDS) 130, an analog-digital converter (ADC) 140, an output buffer 150, a column decoder 160, and a timing controller 170. The respective components of the image sensor 100 as shown in FIG. 1 are examples only. Some of the components can be omitted or additional components can be added based on additional demands.

The image sensor 100 may be a range/depth sensor capable of detecting a distance to an object using the time-of-flight (ToF) technique. In some implementations, a lighting device (not illustrated) may emit a modulated light, which is modulated to a predetermined wavelength, toward a scene to be captured by the image sensor 100, and the image sensor 100 may sense the modulated light (incident light) reflected from objects in the scene and calculate depth information for each pixel. The modulated light and the incident light may be light within an infrared wavelength band. There is a time delay between the transmission of the modulated light and the reception of the reflected light depending on a distance between the image sensor 100 and an object, and such a time delay is represented as a phase difference between signals generated by the image sensor 100. An image processor (not illustrated) may generate a depth image including depth information on each pixel by calculating a phase difference between signals outputted from the image sensor 100.

In some implementations, the lighting device (not illustrated) and the image processor (not illustrated) can be integrated with the image sensor 100 to form a single unit. However, the disclosed technology is not limited thereto and other implementations are also possible. Thus, the lighting device and the image processor can be configured as separate units while not being integrated with the image sensor 100.

The pixel array 110 may include a plurality of pixels which are arranged in the form of a two-dimensional matrix including a plurality of rows and a plurality of columns. Each pixel may convert an incident optical signal into an electrical signal. The pixel array 110 may receive a driving signal from the row decoder 120, and may be driven by the driving signal. The plurality of pixels may include depth pixels that are configured to generate depth images. According to an embodiment, the plurality of pixels may further include color pixels that are configured to generate color images. In this case, a 3D image may be generated based on signals generated by the image sensor 100.

In some implementations, each of the depth pixels may be a current-assisted photonic demodulator (CAPD) pixel. The structure, operation, and manufacturing method of the depth pixels will be described later with reference to the examples depicted in FIGS. 2 to 7.

The pixel array 110 is configured to include CAPD pixels, where each CAPD pixel is provided between two column lines, and the CDS (Correlated Double Sampler) 130, ADC (Analog-to-Digital Converter) 140, and an output buffer 150 for processing a pixel signal outputted from each column line may also be provided for each column line.

The row decoder 120 may drive the pixel array 110 under the control of the timing controller 170. The row decoder 120 may generate a row select signal to select at least one row among the plurality of rows. The row decoder 120 may sequentially enable a pixel reset signal and a transfer signal with respect to pixels corresponding to at least one selected row. A reference signal and an image signal, which are analog signals, are generated from each of the pixels of the selected row and sequentially transferred to the correlated double sampler 130. Here, the reference signal and the image signal may be collectively referred to as a pixel signal.

The correlated double sampler 130 may sequentially sample and hold a reference signal and an image signal, that are provided to each of a plurality of column lines from the pixel array 110. The correlated double sampler 130 may sample and hold the levels of a reference signal and an image signal corresponding to each of the columns of the pixel array 110.

The correlated double sampler 130 may transfer a reference signal and an image signal that are provided from each of the columns to the ADC 140 as a correlated double sampling signal under the control of the timing controller 170.

The ADC 140 may convert a correlated double sampling signal for each of the columns which is outputted from the correlated double sampler 130, into a digital signal, and may output the digital signal. The ADC 140 may perform a counting operation and a calculation operation based on a correlated double sampling signal for each column and a ramp signal provided from the timing controller 170, and thus, may generate image data of a digital type from which noise corresponding to each column (e.g., reset noise specific to each pixel) is removed.

The ADC 140 may include a plurality of column counters corresponding to the columns, respectively, of the pixel array 110, and may convert correlated double sampling signals corresponding to the columns, respectively, into digital signals, by using the column counters. According to another embodiment, the ADC 140 may include one global counter, and may convert a correlated double sampling signal corresponding to each of the columns into a digital signal by using a global code provided from the global counter.

The correlated double sampler 130 and the ADC 140 may be collectively referred to as a pixel signal processor.

The output buffer 150 may capture and output image data of each column unit provided from the ADC 140. The output buffer 150 may temporarily store image data outputted from the ADC 140, under the control of the timing controller 170. The output buffer 150 may operate as an interface which compensates for a difference in transfer (or processing) speed between the image sensor 100 and another device connected thereto.

The column decoder 160 may select a column of the output buffer 150 under the control of the timing controller 170, and image data temporarily stored in the selected column of the output buffer 150 may be sequentially outputted. In detail, the column decoder 160 may receive an address signal from the timing controller 170, may select a column of the output buffer 150 by generating a column select signal based on the address signal, and thereby, may control image data to be outputted as an output signal SO from the selected column of the output buffer 150.

The timing controller 170 may control the row decoder 120, the ADC 140, the output buffer 150, and the column decoder 160.

The timing controller 170 may provide a clock signal required for the operation of each component of the image sensor 100, a control signal for timing control and address signals for selecting a row or a column, to the row decoder 120, the column decoder 160, the ADC 140 and the output buffer 150. According to an embodiment, the timing controller 170 may include a logic control circuit, a phase locked loop (PLL) circuit, a timing control circuit and a communication interface circuit.

Figure 2:
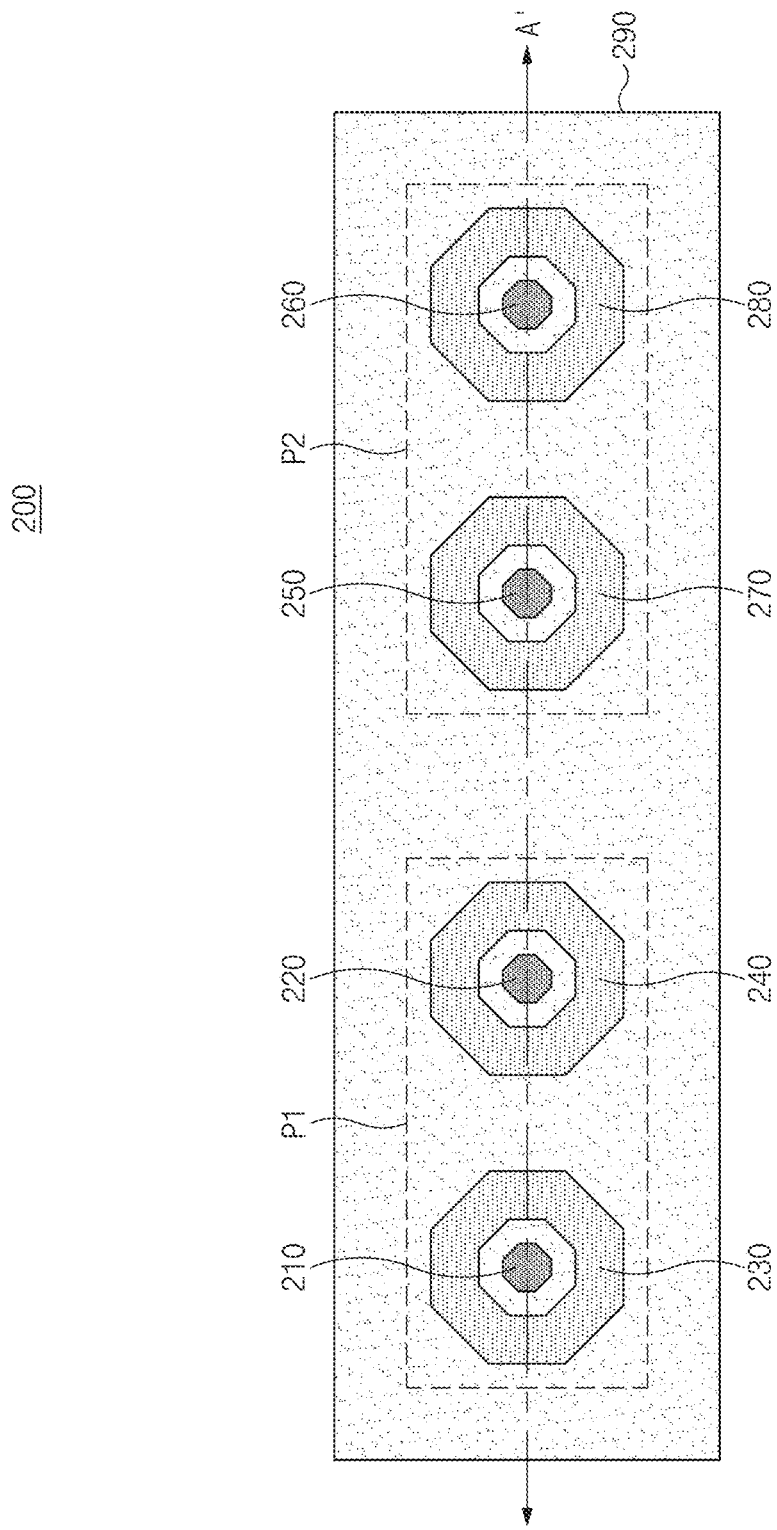
FIG. 2 is an example top view of pixels included in a pixel array illustrated in FIG. 1.
Figure 3:
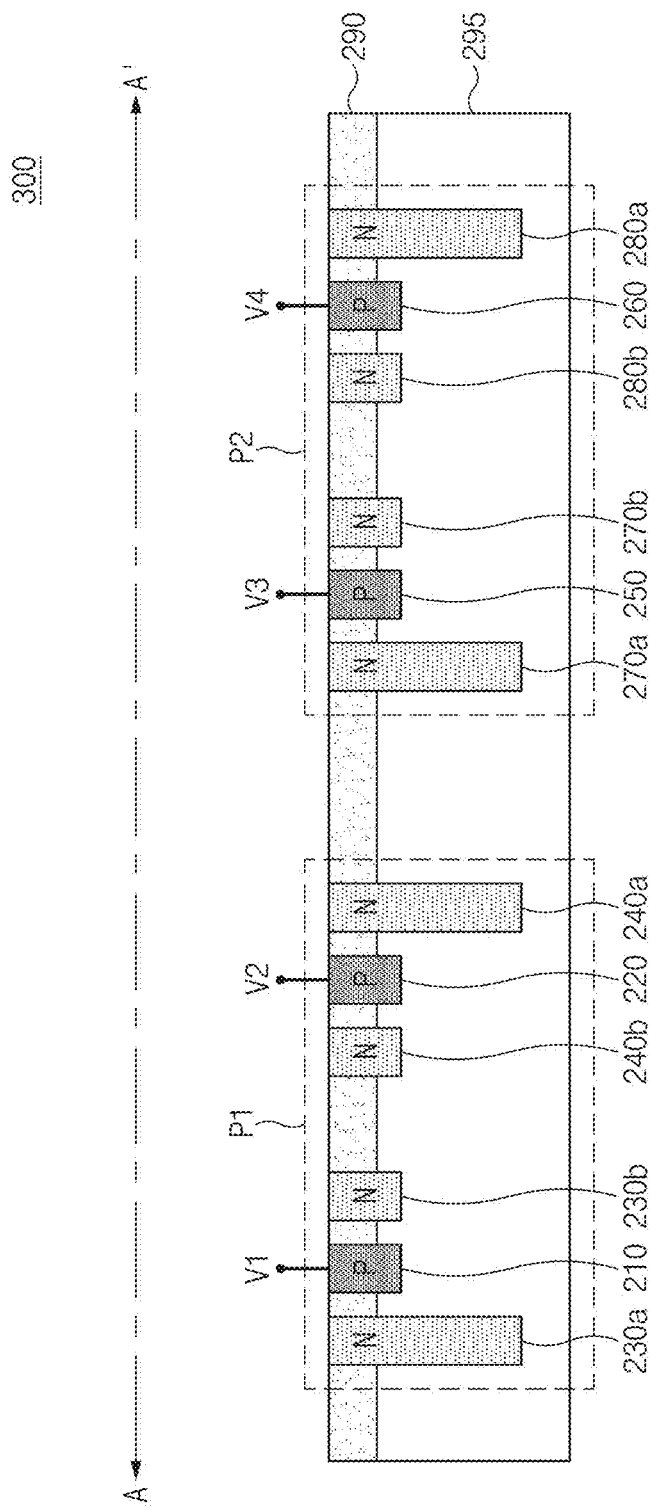
FIG. 3 is an example a cross-sectional view of pixels illustrated in FIG. 2.

FIG. 2 is an example of a top view of pixels included in a pixel array illustrated in FIG. 1. FIG. 3 is an example of a cross-sectional view of pixels illustrated in FIG. 2.

FIG. 2 shows a top view 200 including a first pixel P1 and a second pixel P2 that are adjacent to each other. The pixel array 110 may include pixels arranged in columns and rows and at least some of the pixels may have a substantially same or similar structure as that of the first pixel P1 or the second pixel P2.

The first pixel P1 may include first and second control regions 210 and 220, and first and second detection regions 230 and 240. The first control region 210 and the first detection region 230 may be generally called as a first demodulation node (or a first tap region), and the second control region 220 and the second detection region 240 may be generally called as a second demodulation node (or a second tap region).

The first detection region 230 may be disposed in a shape which surrounds the first control region 210, and the second detection region 240 may be disposed in a shape which surrounds the second control region 220. In FIG. 2, the first and second detection regions 230 and 240 are illustrated as having an octagonal shape, but the disclosed technology is not limited thereto and the first and second detection regions 230 and 240 may be implemented in various shapes such as a circle, polygon, closed ring, etc. In some implementations, the first and second detection regions 230 and 240 may surround parts of the first and second control regions 210 and 220, respectively. In some implementations, the first and second detection regions 230 and 240 may discontinuously surround the first and second control regions 210 and 220, respectively.

The second pixel P2 may include first and second control regions 250 and 260, and first and second detection regions 270 and 280. The first control region 250 and the first detection region 270 may constitute a first demodulation node (or a first tap), and the second control region 260 and the second detection region 280 may constitute a second demodulation node (or a second tap).

The first detection region 270 may be configured as a shape which surrounds the first control region 250, and the second detection region 280 may be configured as a shape which surrounds the second control region 260. In FIG. 2, the first and second detection regions 270 and 280 are illustrated as having octagonal shapes, but the disclosed technology is not limited thereto and the first and second detection regions 270 and 280 may be implemented in various shapes such as a circle, a polygon, a closed ring, etc. In some implementations, the first and second detection regions 270 and 280 may surround parts of the first and second control regions 250 and 260, respectively. In some implementations, the first and second detection regions 270 and 280 may discontinuously surround the first and second control regions 250 and 260, respectively.

The components 210 to 280 which are included in the first pixel P1 and the second pixel P2 may be physically isolated by a dielectric layer 290. For example, the dielectric layer 290 may be disposed between the first control region 210 and the first detection region 230, between the second control region 220 and the second detection region 240, between the first control region 250 and the first detection region 270, and between the second control region 260 and the second detection region 280. The dielectric layer 290 may be an oxide layer, but the disclosed technology is not limited thereto. In some implementations, the first pixel P1 and the second pixel P2 may include additional elements such as wirings, floating diffusions, and transistors but those elements are omitted in FIG. 2 for the concise illustration. In some implementations, the wirings can be configured to apply driving signals to the first pixel P1 and the second pixel P2 and configure reading of pixel signals.

Referring to FIG. 3, a cross-sectional view 300 of pixels included in a pixel array of an image sensor, which is taken along the line A-A' of FIG. 2, is illustrated.

The first pixel P1 and the second pixel P2 may be provided at the substrate 295. The substrate 295 may be a P-type semiconductor substrate. The structure of the first pixel P1 will be discussed first. The first and second control regions 210 and 220 and the first and second detection regions 230 and 340 may be formed on the substrate 295. As illustrated in FIG. 3, the first and second control regions 210 and 220 may be P-type semiconductor regions, and the first and second detection regions 230 and 240 may be N-type semiconductor regions. In the first pixel P1, a first outer detection region 230a and a first inner detection region 230b may be disposed at the left side and right side of the first control region 210. Also, a second inner detection region 240b and a second outer detection region 240a may be disposed at the left side and right side of the second control region 220. The first outer detection region 230a and the first inner detection region 230b correspond to the first detection region 230 of FIG. 2, and the second inner detection region 240b and the second outer detection region 240a correspond to the second detection region 240 of FIG. 2.

In some implementations, the image sensor 100 may be a frontside illumination (FSI) type image sensor in which incident light is incident onto the front surface (the top surface in FIG. 3) of the substrate 295. In some implementations, the image sensor 100 may be a backside illumination (BSI) type image sensor in which incident light is incident onto the back surface (the bottom surface in FIG. 3) of the substrate 295.

The first and second control regions 210 and 220 may receive first and second demodulation control signals V1 and V2, respectively, from the row decoder 120. The potential difference between the first demodulation control signal V1 and the second demodulation control signal V2 generates an electric field (or hole current) which controls the flow of a signal carrier generated in the substrate 295 by incident light.

The first and second detection regions 230 and 240 may capture a signal carrier, and may be coupled with first and second floating diffusions, respectively, which have specific capacitances. Each of the first and second floating diffusions may be coupled to a reset transistor for resetting a corresponding floating diffusion and a source follower which generates an electrical signal depending on the potential of the corresponding floating diffusion. The source follower may be coupled with a selection transistor for outputting, to a column line, the electrical signal outputted from the source follower. Thus, a signal corresponding to a signal carrier which is captured by each of the first and second detection regions 230 and 240 may be outputted to a corresponding column line. A reset control signal for controlling the reset transistor and a select control signal for controlling the selection transistor may be provided from the row decoder 120.

Hereinbelow, the operation of the first pixel P1 will be described in further detail.

In a first period, the substrate 295 may receive incident light and in response to the reception of the incident light, photoelectric conversion of the incident light takes place in the pixel array. As a result of the photoelectric conversion, the incident light may generate electron-hole pairs in the substrate 295; the amount of generated electron-hole pairs may depend on the intensity of the incident light. The row decoder 120 may apply the first demodulation control signal V1 to the first control region 210, and may apply the second demodulation control signal V2 to the second control region 220. A voltage of the first demodulation control signal V1 may be higher than a voltage of the second demodulation control signal V2. For example, a voltage of the first demodulation control signal V1 may be 1.2V, and a voltage of the second demodulation control signal V2 may be 0V.

An electric field may be generated between the first control region 210 and the second control region 220 due to a voltage difference between the voltage of the first demodulation control signal V1 and the voltage of the second demodulation control signal V2, and current may flow from the first control region 210 to the second control region 220. In this case, holes generated in the substrate 295 move toward the second control region 220, and electrons generated in the substrate 295 move toward the first control region 210.

The electrons moved toward the first control region 210 can be captured by the first detection region 230 which is adjacent to the first control region 210. Therefore, the electrons generated in the substrate 295 may be used as a signal carrier for detecting an amount of the incident light.

The electrons captured by the first detection region 230 may be accumulated in the first floating diffusion and change the potential of the first floating diffusion, and the source follower and the selection transistor may output an electrical signal corresponding to the potential of the first floating diffusion, to a column line. The electrical signal may be or include an image signal. Additional operations may be performed on the image signal to generate an image data from the image signal. Such additional operations may include a correlated double sampling using a reference signal (an electrical signal corresponding to the potential of the first floating diffusion after a reset by the reset transistor) and an analog-digital conversion.

In a second period, the relative magnitude of the voltage levels of the first demodulation control signal V1 and the second demodulation control signal V2 is changed from that of the first period. As discussed for the first period, the substrate 295 may receive incident light and in response to the reception of the incident light, the pixel array operates to perform a photoelectric conversion of the incident light. As the incident light is photoelectrically converted, the incident light may generate electron and hole pairs in the substrate 295 depending on the intensity of the incident light. During the second period, the row decoder 120 may apply the first demodulation control signal V1 to the first control region 210, and may apply the second demodulation control signal V2 to the second control region 220, the first demodulation control signal V1 having a voltage level lower than that of the second demodulation control signal V2. For example, a voltage of the first demodulation control signal V1 may be 0V, and a voltage of the second demodulation control signal V2 may be 1.2V.

An electric field may be generated between the first control region 210 and the second control region 220 due to a voltage difference between the voltage of the first demodulation control signal V1 and the voltage of the second demodulation control signal V2. During the second period, the current may flow from the second control region 220 to the first control region 210. In this case, holes generated in the substrate 295 move toward the first control region 210, and electrons in the substrate 295 move toward the second control region 220.

The electrons moved toward the second control region 220 can be captured by the second detection region 240 which is adjacent to the second control region 220. Therefore, the electrons generated in the substrate 295 may be used as a signal carrier for detecting an amount of the incident light.

The electrons captured by the second detection region 240 may be accumulated in the second floating diffusion and change the potential of the second floating diffusion, and the source follower and the selection transistor may output an electrical signal corresponding to the potential of the second floating diffusion, to a column line. Such an electrical signal may be or include an image signal. Based on the image signal, image data can be generated. In some implementations, the image data can be obtained after performing a correlated double sampling using a reference signal (an electrical signal corresponding to the potential of the second floating diffusion after a reset by the reset transistor) and an analog-digital conversion.

The image processor (not illustrated) may perform the calculation of the image data obtained in the first period and the image data obtained in the second period and obtain a phase difference. In some implementations, the image processor may generate a depth image including depth information corresponding to the phase difference of each pixel.

Since the structure and operation of the second pixel P2 are substantially the same as those of the first pixel P1, detailed description for the second pixel P2 will be omitted.

The first pixel P1 and the second pixel P2 are disposed adjacent to each other. When incident light is received into the substrate 295, electrons may be generated not only in the first pixel P1 and the second pixel P2 but also at a position around the first pixel P1 and the second pixel P2, for example, between the first pixel P1 and the second pixel P2. Those electrons generated around the first pixel P1 and the second pixel P2 can provide undesired effects on the images, if those electrons are captured by the first pixel P1 or the second pixel P2. For example, the electrons generated around the first pixel P1 and the second pixel P2 may act as noise in depth information generated in the first pixel P1 or the second pixel P2, which degrades the quality of a depth image.

To obviate or reduce these undesired effects from the electrons generated around the first pixel P1 and the second pixel, some implementations of the disclosed technology provide detection regions that have different thickness each other depending on the locations of the detection regions. For example, two detection regions formed on both sides of a corresponding control detection region are designed such that one of the two detection regions, which is disposed closer to the edge of the pixel, may be formed with a relatively greater thickness and the other of the two detection regions, which is disposed further from the edge of the pixel, may be formed with a relatively smaller thickness.

For example, each of the first and second outer detection regions 230a and 240a, which is disposed closer to the edge of the first pixel P1, may be formed with a relatively greater thickness than each of the first and second inner detection regions 230b and 240b, which is disposed further from the edge of the first pixel P1.

A depth difference between the first outer detection region 230a and the first inner detection region 230b and between the second outer detection region 240a and the second inner detection region 240b may be determined in consideration of the design and the characteristics of the pixel array, e.g., sensitivity of the pixel, pixel size, isolation features of adjacent pixels, etc. In some implementations, the depth difference between the first outer detection region 230a and the first inner detection region 230b and between the second outer detection region 240a and the second inner detection region 240b can be experimentally determined.

Figure 4C:
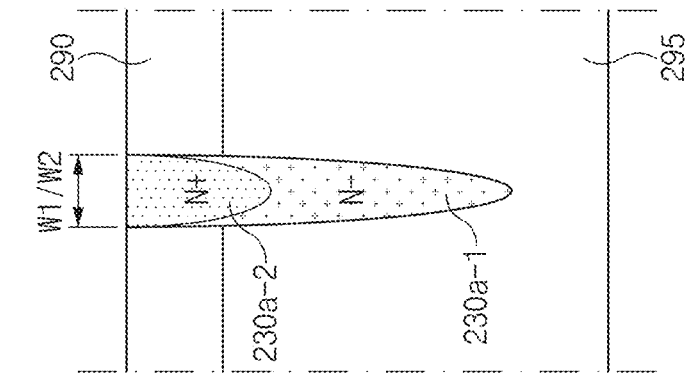
FIGS. 4A to 4C are diagrams, each illustrating a representation of an example of a first outer detection region illustrated in FIG. 3.
Figure 4B:
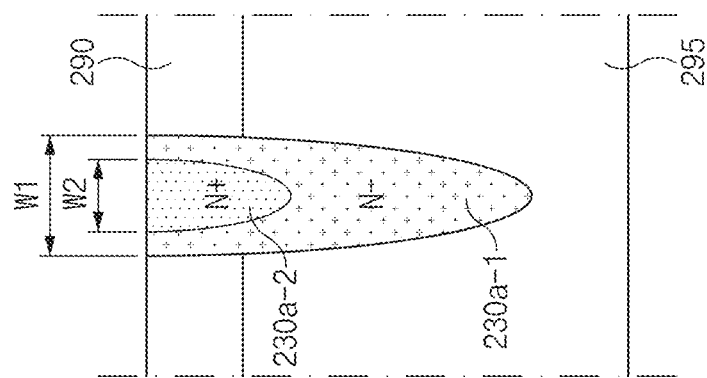
Figure 4A:
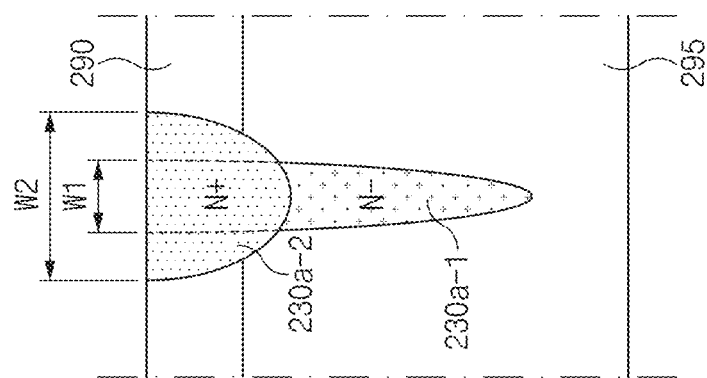

FIGS. 4A to 4C are diagrams, each illustrating a representation of an embodiment of a first outer detection region illustrated in FIG. 3.

Referring to FIGS. 4A to 4C, embodiments of the first outer detection region 230a illustrated in FIG. 3 are illustrated in further detail.

The first outer detection region 230a may include regions that have different doping concentrations. For example, the first outer detection region 230a may include an N− region 230a-1 and an N+ region 230a-2. The N− region 230a-1 is doped with a relatively lower N-type impurities, and the N+ region 230a-2 is doped with a relatively higher N-type impurities. In some implementations, unlike the first outer detection region 230a, the first inner detection region 230b may include an N+ region only without an N− region.

In some implementations, the N+ region 230a-2 captures electrons that is the signal carrier described with reference to FIG. 3, and the N− region 230a-1 may not contribute to the capture of electrons.

The embodiments of FIGS. 4A to 4C show that the N− region 230a-1 is formed deeper than the N+ region 230a-2.

In the embodiment of FIG. 4A, a first width W1 of the N− region 230a-1 may be smaller than a second width W2 of the N+ region 230a-2. In FIG. 4A, the first width W1 may denote the width of an extended N-region (see the dotted line) that is brought into the contact with the top surface of the dielectric layer 290. The second width W2 may mean the width of the N+ region 230a-2 that is brought into the contact with the top surface of the dielectric layer 290. In this case, since the N+ region 230a-2 which captures electrons may be brought into contact with the substrate 295, the electron detection capability of the first outer detection region 230a can be improved.

In FIGS. 4B and 4C, the first width W1 and the second width may denote the widths of the N− region 230a-1 and the N+ region 230a-2 that are brought into contact with the top surface of the dielectric layer 290.

In the embodiment of FIG. 4B, the first width W1 of the N− region 230a-1 may be larger than the second width W2 of the N+ region 230a-2. In this case, the N− region 230a-1 which does not capture electrons surrounds the N+ region 230a-2 with a relatively greater thickness as compared to the case as shown in FIG. 4C. Thus, the electron blocking capability of the first outer detection region 230a can be improved. Here, electron blocking capability may mean the capability to prevent or block the movement of electrons between the inside of the pixel and the region outside the pixel, for example the region between the corresponding pixel and its adjacent pixels. For example, the electrons generated in the region between two adjacent pixels cannot easily move into the inside of any pixel. In some implementations, the inside of the pixel may be positioned at one side of the first outer detection region 23a and the region between the two adjacent pixels may be positioned at the other side of the first outer detection region 230.

In the embodiment of FIG. 4C, the first width W1 of the N− region 230a-1 may be substantially the same as the second width W2 of the N+ region 230a-2. In this case, since the N− region 230a-1 which does not capture electrons surrounds the N+ region 230a-2 with a relatively smaller thickness as compared to the embodiment of FIG. 4B, the electron detection capability and electron blocking capability of the first outer detection region 230a may be appropriately balanced.

Although FIGS. 4A to 4C illustrate the first outer detection region 230a as an example, the description discussed for the first outer detection region 230a can be applied for other outer detection regions 240a, 270a and 280a.

Figure 5:
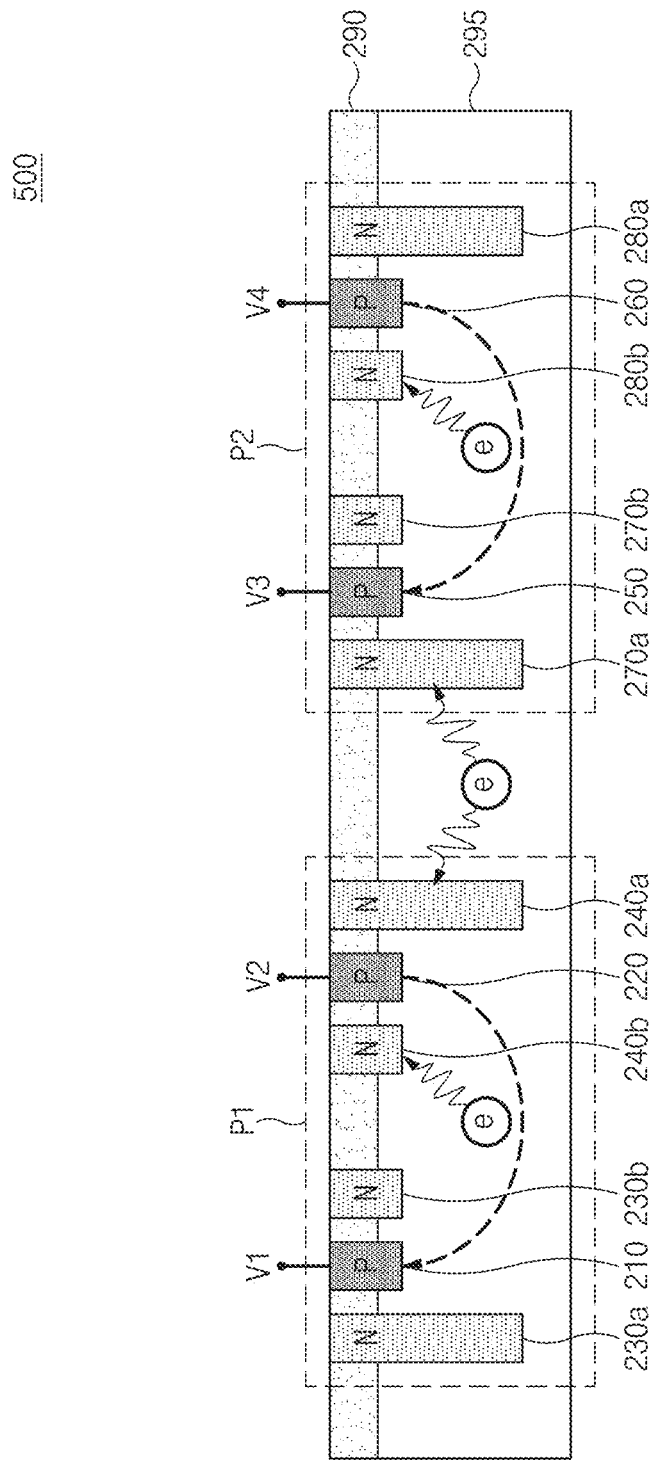
FIG. 5 is an example of a diagram to explain a function of first and second outer detection regions illustrated in FIG. 3.

FIG. 5 is a representation of an example of a diagram to explain a function of first and second outer detection regions illustrated in FIG. 3.

Referring to FIG. 5, a cross-section view 500 schematically illustrates the flow of electrons in the case where a low voltage is applied to the first control regions 210 and 250 and a high voltage is applied to the second control regions 220 and 260.

Electrons may be generated in the respective parts of the substrate 295 that are positioned inside the first pixel P1 and the second pixel P2. In the first pixel P1 and the second pixel P2, the generated electrons may move to the second control regions 220 and 260 due to the electric fields corresponding to current flowing from the second control regions 220 and 260 to the first control regions 210 and 250. The electros moved to the second control regions 220 and 260 can be captured by the second detection regions 240 and 280.

Electrons may be also generated in the part of the substrate 295 that is positioned between the first pixel P1 and the second pixel P2 arranged adjacent to the first pixel P1. The electrons generated at the position between the first pixel P1 and the second pixel P2, however, may be blocked by the second and first outer detection regions 240a and 270a, which makes it difficult for the electrons to move toward the corresponding control regions. For example, the electrons cannot move to the second control region 220 or the first control region 250 or even if some of the electrons are successfully moved to the second control region 220 or the first control region 250, an amount of those electrons can be significantly reduced as compared to the case when the outer detection regions 240a and 270a are designed with the same small thickness as that of the inner detection regions 240b and 270b. In some implementations, a pixel is designed to include inner and outer detection regions that are arranged on both sides of a corresponding control region to have the asymmetric structure, e.g., the thickness of the outer detection region is greater than the thickness of the inner detection region. With this structure, the flow of hole current between adjacent pixels can be effectively blocked. Thus, it is possible to improve the performance of the image sensor by preventing the movement of electrons between adjacent pixels, which is likely to act as noise in the operation of the image sensor.

In the example of FIG. 5, the first outer detection region 270a and the second outer detection region 240a block the movement of electrons generated in the part of the substrate 295 that is positioned between the first pixel P1 and the second pixel P2 adjacent to the first pixel P1. Thus, noise in depth information generated from the first pixel P1 or the second pixel P2 can be significantly reduced, and the quality of a depth image can be improved.

In some implementations, a low voltage may be applied to the first control region 210 and the second control region 260, and a high voltage may be applied to the second control region 220 and the first control region 250. As different voltages are applied to a first control region and a second control region that are arranged in the same pixel and the same voltage is applied to a first control region and a second control region that are arranged in adjacent pixels, an electric field which induces movement of electrons can be generated within in each pixel, and the movement of electrons generated in the part of the substrate 295 that is positioned between the first pixel P1 and the second pixel P2 adjacent to the first pixel P1 can be suppressed.

FIGS. 6A, 6B, 7A and 7B are examples of diagrams to explain a process for forming first and second detection regions illustrated in FIG. 3.

Figure 6A:
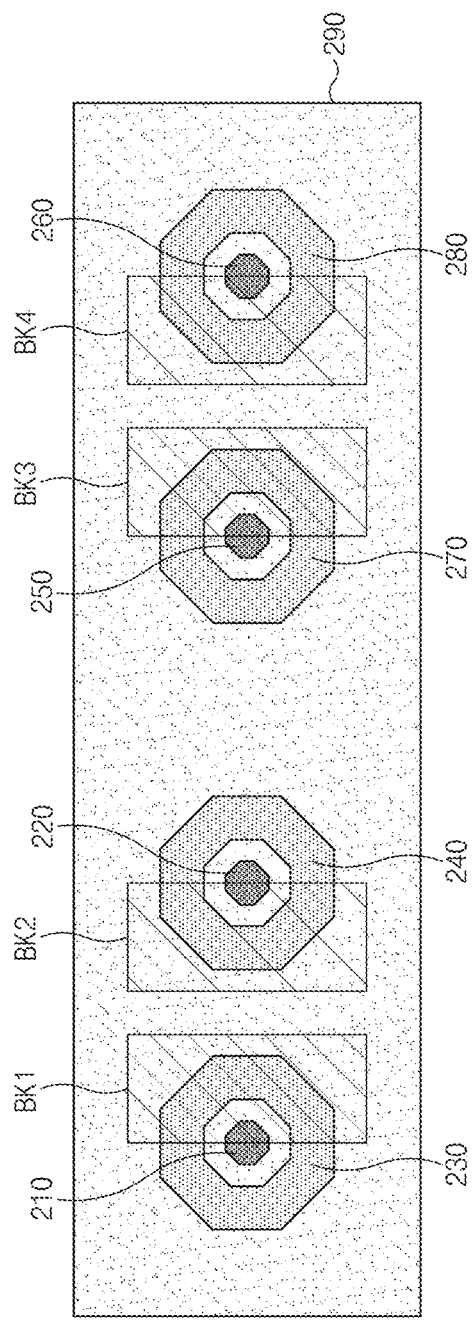
FIGS. 6A and 6B are examples of views of pixels to explain a process for forming first and second detection regions illustrated in FIG. 3.
Figure 6B:
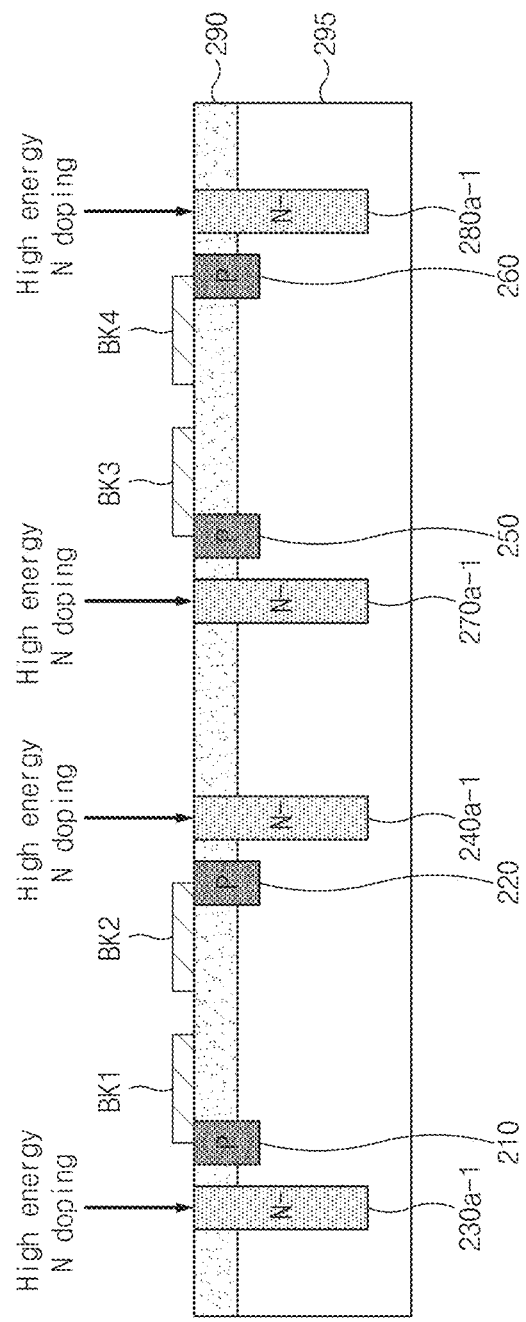

In FIGS. 6A and 6B, block layers BK1 to BK4 are used to form N− regions 230a-1, 240a-1, 270a-1 and 280a-1 of the first and second outer detection regions 230a, 240a, 270a and 280a.

In some implementations, the dielectric layer 290 is formed on the substrate 295 through an oxidation process and the first and second control regions 210, 220, 250 and 260 are formed through an ion implantation process of implanting P+ type ions.

The block layers BK1 to BK4 may be disposed on the dielectric layer 290 to overlap with the respective parts of the corresponding detection regions 230b, 240b, 270b, and 280b. For example, the block layer BK1 to BK4 overlap with the halves of the first detection region 230, the second detection region 240, the first detection region 270, and the second detection region, 280, respectively. The overlapping halves of the first and second detection regions 230, 240, 270, and 280 may correspond to the inner halves of the corresponding detection regions. The block layers BK1 to BK4 may be or include nanowire (NW) block layers, but other implementations are also possible. In some implementations, unlike the illustration of FIGS. 6A-B, each of the block layers BK1 to BK4 may have parts split from each other. In some implementations, the block layers BK1 to BK4 may have shapes corresponding to the patterns of the first and second inner detection regions 230b, 240b, 270b and 280b.

With the block layers BK1 to BK4 disposed on the dielectric layer 290, an ion implantation process of implanting N− type ions with relatively high energy may be performed. As the result, the N− regions 230a-1, 240a-1, 270a-1 and 280a-1 which are doped with N− impurities to a depth corresponding to the high energy may be formed in the dielectric layer 290 and the substrate 295.

In some implementations, an ion implantation process of implanting N− type ions may be performed at least twice. For example, before disposing the block layers BK1 to BK4, additional block layers which have an area wider than the block layers BK1 to BK4 and extend from the inner part of pixels may be disposed. In some implementations, the additional block layers may extend from the inner part of pixels toward the outer part of pixels. In some implementations, the additional block layers may be disposed over the first detection region 230 to overlap three quarters of the first detection region 230 along a horizontal direction. An ion implantation process of implanting N− type ions with high energy may be performed while the additional block layers are disposed. Then, after implanting N-type ions with high energy, the block layers BK1 to BK4 may be disposed. Then, an ion implantation process of implanting N-type ions with lower energy may be performed. Through these ion implantation processes, the first and second outer detection regions may be formed with a greater thickness than that of the first and second inner detection region. Accordingly, it is possible to optimize and improve the electron blocking capability and the electron detection capability of the first and second outer detection regions.

Figure 7A:
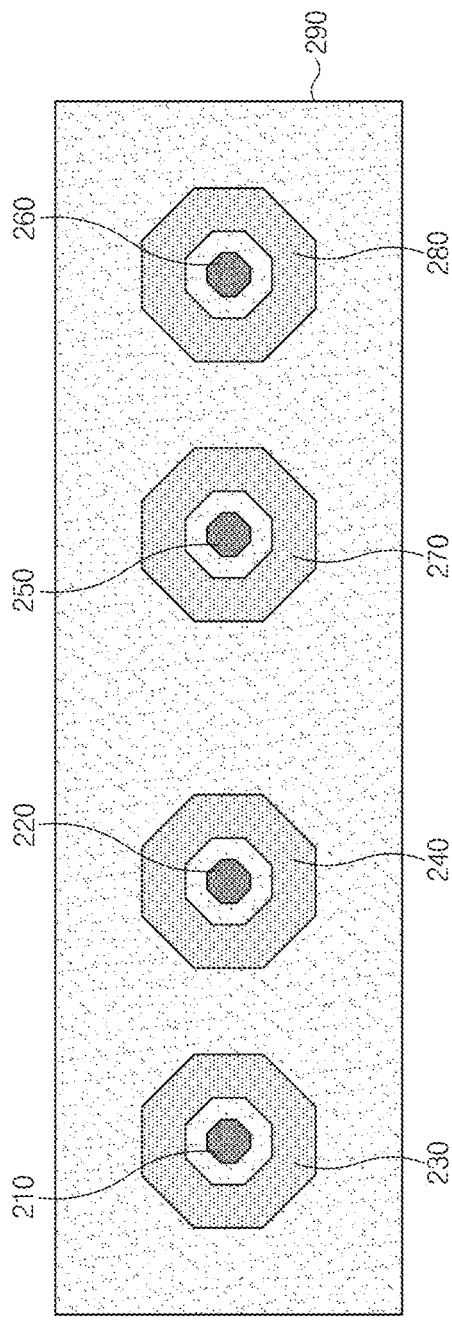
FIGS. 7A and 7B are examples of views to explain a process for forming first and second detection regions illustrated in FIG. 3.
Figure 7B:
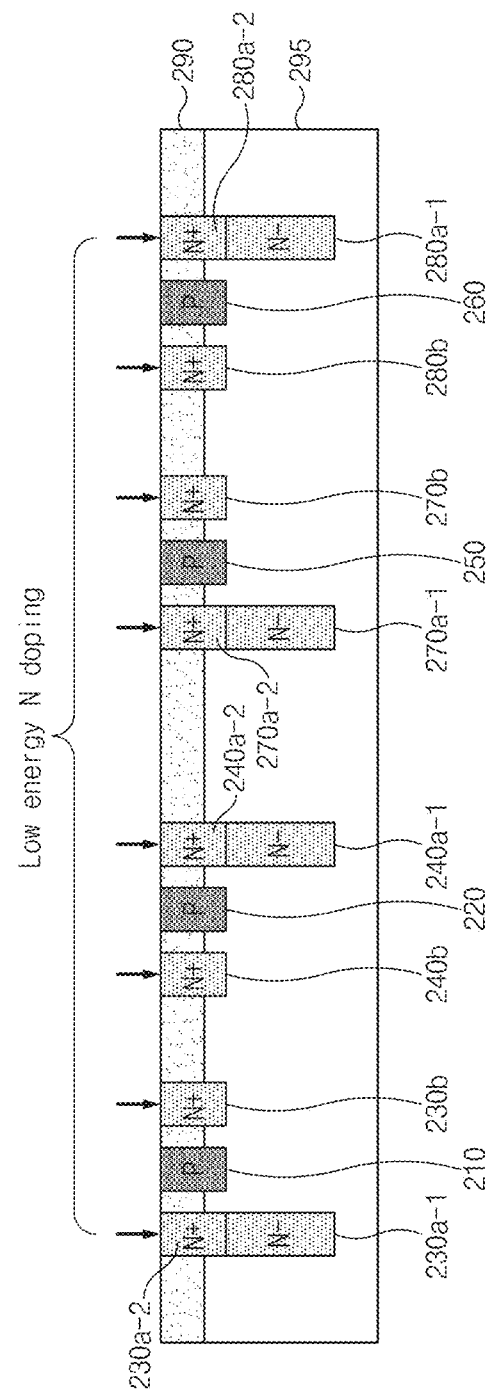

In FIGS. 7A and 7B, in order to form N+ regions 230a-2, 240a-2, 270a-2 and 280a-2 of the first and second outer detection regions 230a, 240a, 270a and 280a and the first and second inner detection regions 230b, 240b, 270b and 280b, the block layers BK1 to BK4 may be removed, and an ion implantation process of implanting N+ type ions with energy lower than the energy used in the ion implantation process of implanting N− type ions may be performed. As the result, the N+ regions 230a-2, 240a-2, 270a-2 and 280a-2 and the first and second inner detection regions 230b, 240b, 270b and 280b which are doped with N+ impurities to a depth corresponding to the low energy may be formed in the dielectric layer 290 and the substrate 295.

Figure 8A:
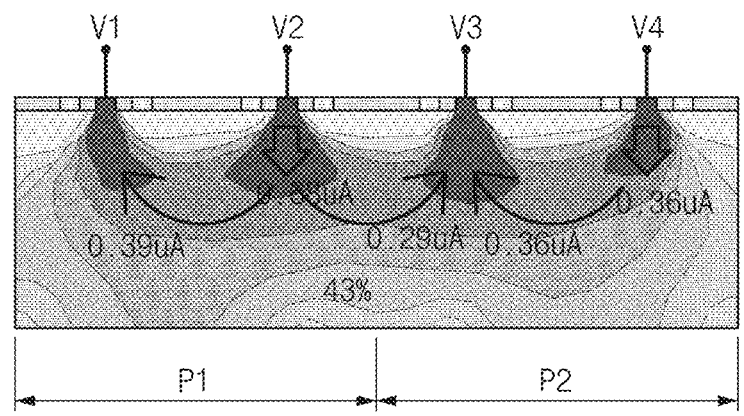
FIGS. 8A and 8B show simulation results illustrating a flow of hole current in adjacent pixels including detection regions having a symmetrical structure and an asymmetrical structure.
Figure 8B:
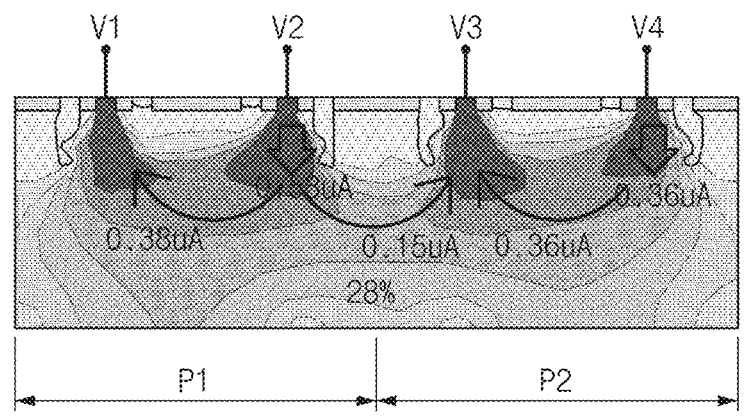

FIGS. 8A and 8B show simulation results illustrating a flow of hole current in adjacent pixels including detection regions having a symmetrical structure and an asymmetrical structure.

FIG. 8A illustrates the flow of hole current in the first pixel P1 and the second pixel P2 which include first and second detection regions having a symmetrical structure. The first and second pixels P1 and P2 are adjacent to each other. Hole current of 0.68 µA supplied through the second control region 220 of the first pixel P1 is divided into hole current of 0.39 µA flowing toward the first control region 210 of the first pixel P1 and hole current of 0.29 µA flowing toward the first control region 250 of the second pixel P2. The hole current of 0.29 µA, which flows toward the first control region 250 of the second pixel P2, becomes the current flowing between the adjacent pixels P1 and P2. The amount of the hole current, i.e., 0.29 µA, corresponds to about 43% of the hole current of 0.68 µA supplied through the second control region 220 of the first pixel P1, which causes electrons generated between the adjacent pixels to move and induce noise.

FIG. 8B illustrates the flow of hole current in the first pixel P1 and the second pixel P2 which include first and second detection regions having an asymmetrical structure. The first and second pixels P1 and P2 are adjacent to each other. Hole current of 0.53 µA supplied through the second control region 220 of the first pixel P1 is divided into hole current of 0.38 µA flowing toward the first control region 210 of the first pixel P1 and hole current of 0.15 µA flowing toward the first control region 250 of the second pixel P2. Thus, only the hole current of 0.15 µA corresponding to about 28% of the entire hole current of 0.53 µA flows between adjacent pixels. As compared to it may be seen that the hole current of 0.15 µA is significantly low as compared with the left of FIG. 8A.

Also, although not illustrated, it was confirmed in an additional simulation that, as a depth of the first and second outer detection regions becomes deeper, the current amount of the hole current flowing between adjacent pixels decreases.

Figure 9A:
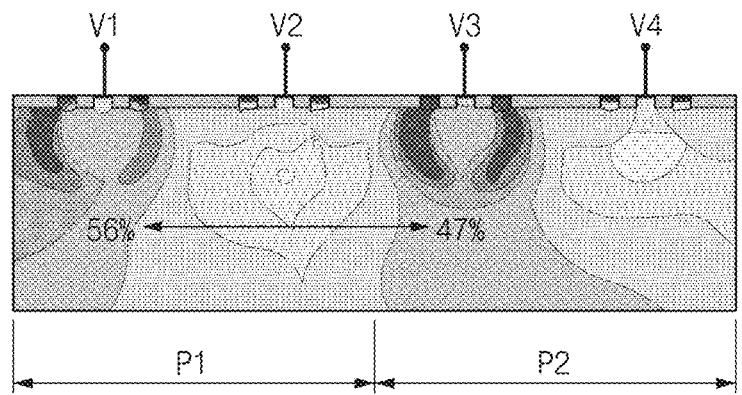
FIGS. 9A and 9B show simulation results of demodulation contrast in adjacent pixels including detection regions having a symmetrical structure and an asymmetrical structure.
Figure 9B:
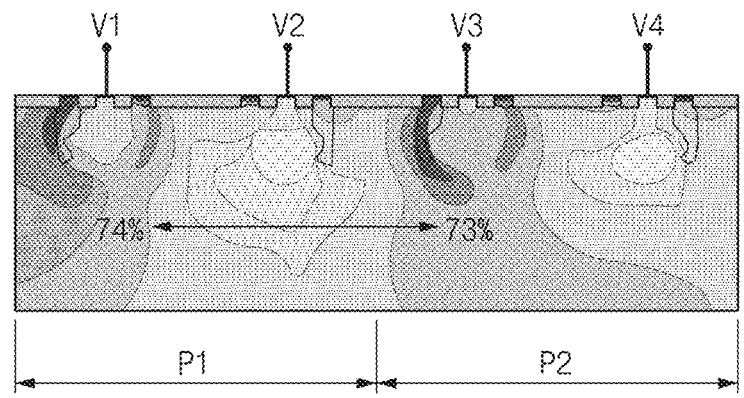

FIGS. 9A and 9B show simulation results of demodulation contrast in adjacent pixels including detection regions having a symmetrical structure and an asymmetrical structure.

FIG. 9A illustrates demodulation contrast in the first pixel P1 and the second pixel P2 which include first and second detection regions having a symmetrical structure and are adjacent to each other. Demodulation contrast, which is an index indicating the demodulation performance of a CAPD pixel, denotes the percentage of electrons captured in an activated demodulation node (e.g., a demodulation node including a control region to which a higher voltage is applied), among entire electrons generated by incident light in the substrate 295. The demodulation contrast indicates the sensitivity of a pixel. Noise performance is excellent when each pixel has a uniform and high demodulation contrast.

In the case where the first and second detection regions have a symmetrical structure, a difference in demodulation contrast between the first pixel P1 and the second pixel P2 corresponds to about 9% as obtained by subtracting 47% from 56%.

FIG. 9B illustrates demodulation contrast in the first pixel P1 and the second pixel P2 which include first and second detection regions having an asymmetrical structure and are adjacent to each other. In FIG. 9B, a difference in demodulation contrast between the first pixel P1 and the second pixel P2 corresponds to about 1% as obtained by subtracting 73% from 74%.

As electrons generated in the part of the substrate 295 positioned between the first pixel P1 and the second pixel P2 are movable toward the first pixel P1 or the second pixel P2, those electrons can be captured by the first pixel P1 or the second pixel P2, which degrades the demodulation contrast performance and demodulation contrast uniformity of the first pixel P1 and the second pixel P2. However, for the pixels having the first and second detection regions with the asymmetrical structure, since the asymmetrical structure of the first and second detection regions prevents or reduces the movement of the electrons generated between the first pixel P1 and the second pixel P2, the demodulation contrast performance and demodulation contrast uniformity of the first pixel P1 and the second pixel P2 can be improved.

It should be understood that the various embodiments of the present document and the terminology used herein are intended not to limit the technical features described in this document to the specific embodiments but to include various modifications, equivalents, or alternatives of the embodiments. In the description of the drawings, like reference numerals may be used for similar or related components.

What is claimed is:

1. An image sensor pixel, comprising:
a control region arranged in a substrate and configured to receive a control signal and generate a current corresponding to the control signal, the current controlling movements of electrons generated in response to incident light; and
an inner detection region and an outer detection region that are arranged on both sides of the control region and configured to capture the generated electrons,
wherein the outer detection region has a thickness greater than a thickness of the inner detection region.

2. The image sensor pixel of claim 1, wherein the outer detection region includes an N− region doped with N− impurities and an N+ region doped with N+ impurities.

3. The image sensor pixel of claim 2, wherein a width of the N− region is smaller than a width of the N+ region.

4. The image sensor pixel of claim 2, wherein a width of the N− region is larger than a width of the N+ region.

5. The image sensor pixel of claim 2, wherein a width of the N− region is substantially equal to a width of the N+ region.

6. The image sensor pixel of claim 1, wherein the outer detection region is disposed closer to an adjacent pixel than the inner detection region is.

7. The image sensor pixel of claim 1, wherein the inner detection region and the outer detection region are disposed to surround the control region.

8. The image sensor pixel of claim 1, wherein the inner detection region and the outer detection region are integrated with each other to have an octagonal or circular shape.

9. The image sensor pixel of claim 1, wherein the image sensor pixel is a current-assisted photonic demodulator (CAPD) pixel.

10. An image sensor, comprising:
a first pixel and a second pixel that are disposed in a substrate to form adjacent pixels,
wherein each of the first pixel and the second pixel comprises:
a control region arranged in the substrate and configured to generate a current flowing in the substrate; and
an inner detection region and an outer detection region that are arranged on both sides of the control region and configured to capture electrons generated by incident light and movable by the current, and
wherein the outer detection region has a thickness greater than a thickness of the inner detection region.

11. The image sensor according to claim 10, wherein the outer detection region of each of the first pixel and the second pixel includes an N− region which is doped with N− impurities and an N+ region doped with N+ impurities.

12. The image sensor according to claim 11, wherein a width of the N− region is smaller than a width of the N+ region.

13. The image sensor according to claim 11, wherein a width of the N− region is larger than a width of the N+ region.

14. The image sensor according to claim 11, wherein a width of the N− region is substantially same as a width of the N+ region.

15. The image sensor according to claim 10, wherein, compared to the inner detection region of the first pixel, the outer detection region of the first pixel is disposed closer to the second pixel, and, compared to the inner detection region of the second pixel, the outer detection region of the second pixel is disposed closer to the first pixel.

16. The image sensor according to claim 10, wherein the inner detection region and the outer detection region of at least one of the first pixel or the second pixel are disposed to surround the control region.

17. The image sensor according to claim 10, wherein the inner detection region and the outer detection region of at least one of the first pixel or the second pixel are integrated with each other to have an octagonal or circular shape.

18. The image sensor according to claim 10, wherein the control region of the first pixel and the control region of the second pixel receive control signals having the same voltage values.

19. An image sensor, comprising:
- a plurality of pixels arranged in a substrate, each pixel including first and second control regions to enable a current flow in the substrate, and first and second detection regions to capture electrons generated by incident light and movable by the current;
- a row decoder coupled to the plurality of pixels and configured to drive the plurality of pixels; and
- a pixel signal processing circuit coupled to the plurality of pixels and configured to perform an analog-digital conversion for pixel signals outputted from the plurality of pixels,
- wherein each of the first and second detection regions includes an inner detection region and an outer detection region, and a depth of the outer detection region of each of the first and second detection regions is deeper than a depth of the inner detection region of each of the first and second detection regions.

20. The image sensor according to claim 19,
- wherein, in a first period, the row decoder is configured to apply a relatively higher voltage to the first control region compared to the second control region, and the pixel signal processing circuit is configured to generate image data based on electrons captured by the first detection region which surrounds the first control region, and
- wherein, in a second period, the row decoder is configured to apply a relatively lower voltage to the first control region compared to the second control region, and the pixel signal processing circuit is configured to generate image data based on electrons captured by the second detection region which surrounds the second control region.

\* \* \* \* \*